(12) United States Patent
Hur et al.

(10) Patent No.: US 12,244,546 B2
(45) Date of Patent: *Mar. 4, 2025

(54) FULL-DUPLEX ELECTRICAL BALANCED DUPLEXER

(71) Applicant: Apple Inc., Cupertino, CA (US)

(72) Inventors: Joonhoi Hur, Sunnyvale, CA (US); Harald Pretl, Schwertberg (AT); Rastislav Vazny, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/947,813

(22) Filed: Sep. 19, 2022

(65) Prior Publication Data

US 2023/0011044 A1 Jan. 12, 2023

Related U.S. Application Data

(63) Continuation of application No. 17/031,440, filed on Sep. 24, 2020, now Pat. No. 11,791,973.

(51) Int. Cl.
*H04B 1/525* (2015.01)
*H01P 1/36* (2006.01)
(Continued)

(52) U.S. Cl.
CPC ............ *H04L 5/1461* (2013.01); *H04L 27/20* (2013.01); *H04L 27/22* (2013.01)

(58) Field of Classification Search
CPC ....... H04L 5/1461; H04L 27/20; H04L 27/22; H04B 1/56; H04B 1/525; H04B 1/0057;
(Continued)

(56) References Cited

U.S. PATENT DOCUMENTS

| 6,937,666 B2 | 8/2005 | Pasternak et al. |
| 7,756,486 B1 | 7/2010 | Tan et al. |

(Continued)

FOREIGN PATENT DOCUMENTS

| CN | 101189804 A | 5/2008 |
| CN | 101636923 A | 1/2010 |

(Continued)

OTHER PUBLICATIONS

ISSCC 2016/Session 9/High-Perfonnance Wireless/9.8, Receiver with Integrated Magnetic-Free N-Path-Filter-Based Non-Reciprocal Circulator and Baseband Self-Interference Cancellation for Full-Duplex Wireless; IEEE 2016 (Year: 2016).*

(Continued)

*Primary Examiner* — Edan Orgad
*Assistant Examiner* — Vanneilian Lalchinthang
(74) *Attorney, Agent, or Firm* — FLETCHER YODER PC

(57) ABSTRACT

Embodiments disclosed herein relate to improving an available bandwidth for a transceiver of an electronic device and to reducing a footprint of an associated integrated circuit of the electronic device. To do so, an isolation circuit is disposed between a transmit circuit and a receive circuit. The isolation circuit has first and second signal paths. A first portion of the signal propagates along the first signal path and a second portion of the signal propagates along the second signal path. A non-reciprocal phase shifter is disposed on the first signal path to shift a phase of the first portion to match a phase of the second portion and improve isolation between the transmit circuit and the receive circuit. The phase-shifted first portion may be combined with the second portion to reduce or substantially eliminate an insertion loss caused by the isolation circuit.

20 Claims, 8 Drawing Sheets

(51) Int. Cl.

| | |
|---|---|
| *H01Q 3/36* | (2006.01) |
| *H03H 7/00* | (2006.01) |
| *H04B 1/44* | (2006.01) |
| *H04L 5/14* | (2006.01) |
| *H04L 27/20* | (2006.01) |
| *H04L 27/22* | (2006.01) |

(58) Field of Classification Search
CPC ........ H04B 1/0458; H04B 1/18; H04B 1/385; H04B 1/54; H04B 2001/3861; H04B 1/48; H01Q 1/523; H01Q 3/36; H01Q 3/267; H03H 7/18; H03H 7/38; H03H 7/463; H03H 7/1775; H03H 7/19; H03H 7/00; H01P 1/36
USPC ........................................................ 370/282
See application file for complete search history.

(56) References Cited

U.S. PATENT DOCUMENTS

| | | | |
|---|---|---|---|
| 8,908,668 | B2 | 12/2014 | Kim |
| 9,490,866 | B2* | 11/2016 | Goel ...................... H04B 1/525 |
| 10,270,149 | B2* | 4/2019 | Hou ...................... H04B 1/0458 |
| 2003/0176174 | A1 | 9/2003 | Seppinen et al. |
| 2007/0117524 | A1 | 5/2007 | Do |
| 2008/0227409 | A1 | 9/2008 | Chang et al. |
| 2013/0244594 | A1 | 9/2013 | Alrabadi et al. |
| 2014/0086109 | A1 | 3/2014 | Bagger |
| 2014/0327594 | A1* | 11/2014 | Zhang ...................... H03H 7/40 343/861 |
| 2015/0085710 | A1 | 3/2015 | Yoon et al. |
| 2015/0146583 | A1 | 5/2015 | Yoon et al. |
| 2015/0156005 | A1 | 6/2015 | Sjöland |
| 2016/0087823 | A1 | 3/2016 | Wang |
| 2016/0112226 | A1 | 4/2016 | Martinez et al. |
| 2016/0173317 | A1 | 6/2016 | Bitton |
| 2017/0358857 | A1 | 12/2017 | Watkins |
| 2018/0123635 | A1* | 5/2018 | Settaf ...................... H04B 1/48 |
| 2019/0198999 | A1 | 6/2019 | Ashrafi |
| 2019/0319681 | A1* | 10/2019 | Natarajan .............. H04B 1/525 |
| 2019/0326946 | A1* | 10/2019 | Cox ...................... H04B 1/525 |
| 2019/0372190 | A1* | 12/2019 | Kord ...................... H03H 11/04 |
| 2020/0106474 | A1 | 4/2020 | Hur et al. |
| 2020/0244301 | A1* | 7/2020 | Askar ...................... H04B 1/40 |
| 2021/0184723 | A1* | 6/2021 | Brighenti ............. H04B 17/354 |
| 2021/0242552 | A1* | 8/2021 | Nagulu ................ H03D 7/1441 |
| 2021/0273773 | A1 | 9/2021 | Yi et al. |
| 2021/0349191 | A1* | 11/2021 | Bi ........................ G01S 7/4812 |
| 2021/0384600 | A1* | 12/2021 | Nagulu .................. H03D 7/165 |
| 2023/0387943 | A1* | 11/2023 | Laughlin .................. H04B 1/44 |

FOREIGN PATENT DOCUMENTS

| | | |
|---|---|---|
| CN | 103297069 A | 9/2013 |
| CN | 103326738 A | 9/2013 |
| CN | 103684513 A | 3/2014 |
| CN | 105144593 A | 12/2015 |
| CN | 105703798 A | 6/2016 |
| CN | 111512558 A | 8/2020 |
| JP | 2017-225105 A | 12/2017 |
| KR | 20110062399 A | 6/2011 |
| KR | 20130031786 A | 3/2013 |
| KR | 10-2013-0121494 A | 11/2013 |
| WO | 2014151055 A1 | 9/2014 |
| WO | 2019077122 A1 | 4/2019 |

OTHER PUBLICATIONS

ISSCC 2016/Session 9/High-Performance Wireless/9.8, "Receiver with Integrated Magnetic-Free N-Path-Filter-Based Non-Reciprocal Circulator and Baseband Self-Interference Cancellation for Full-Duplex Wireless", IEEE 2016.
Korean Office Action for Korean Patent Application No. 10-2021-0124613 dated Jul. 11, 2022; 4 pgs.
First Office Action for Chinese Patent Application No. 202111107548.2 dated Jan. 28, 2023; 8 pgs.
Notice of Allowance for Chinese Patent Application No. 2021111075482 dated Jul. 18, 2023; 5 pgs.
Zhou Youfu et al.; Reliable Transmission; IoT Technology 2006, Issue 10, China Academic Journal Electronic Publishing House [http://www.cnki.net].
Notice of Allowance for Korean Patent Application No. 10-2023-0046763, dated Jun. 4, 2024; 5 pgs.

* cited by examiner

FULL-DUPLEX ELECTRICAL BALANCED DUPLEXER

CROSS REFERENCE TO RELATED APPLICATION

This application is a continuation of U.S. patent application Ser. No. 17/031,440 entitled "FULL-DUPLEX ELECTRICAL BALANCED DUPLEXER," filed on Sep. 24, 2020, which is hereby incorporated by reference in its entirety for all purposes.

BACKGROUND

The present disclosure generally relates to wireless communication systems and, more specifically, to isolating wireless signals between transmitters and receivers in wireless communication devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In an electronic device, a transmitter and a receiver may each be coupled to an antenna to enable the electronic device to both transmit and receive wireless signals. Certain electronic devices may include isolation circuitry having an electrical balanced duplexer (EBD) that isolates the transmitter from received signals of a first frequency range, and the receiver from transmission signals of a second frequency range (e.g., thus implementing frequency division duplex (FDD) operations), thus reducing interference when communicating. In such electronic devices, an impedance tuner may be used to match the impedance of the antenna to increase effectiveness of this isolation. However, as indicated above, using the FDD duplexer may limit a bandwidth available for receiving signals and transmitting signals (e.g., to about 100 megahertz (MHz) for each operation) compared to a "true" full-duplex transceiver (e.g., one that enables transmitting and receiving wireless signals at the same time and over the same frequency range). For example, when using an FDD duplexer, a bandwidth for transmitting signals may be about 20 MHz and a bandwidth for receiving signals may also be about 20 MHz.

Further, utilizing an FDD duplexer transceiver requires at least two cables (e.g., one for transmitting signals at a first frequency range, another for receiving signals at a second frequency range). Utilizing two cables rather than a single cable to receive and transmit signals over the same frequency range takes up valuable space in the electronic device. As a result, the electronic device having two cables may be larger in size or prevent incorporating additional circuitry in the electronic device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments presented herein provide a "true" full-duplex transceiver that enables transmitting and receiving wireless signals at the same time and over the same frequency range. Accordingly, the full-duplex transceiver enables an increased bandwidth available for receiving and transmitting signals. For example, the available bandwidth for both receiving and transmitting may be about 100 MHZ to about 200 MHz. In some embodiments, the bandwidth for both receiving and transmitting may be about 500 MHz to about 1000 MHz. Further, the full-duplex transceiver enables a single cable to be used between integrated circuits of an electronic device for transmitting and receiving signals at the same frequency simultaneously, thus reducing the size of the electronic device or enabling more circuitry to be added to the electronic device.

The embodiments presented herein also maintain or improve isolation of the transmitter and receiver of an electronic device. In particular, the embodiments disclosed herein include two circuit paths between one or more antennas and an isolation circuit. The isolation circuit is disposed between, and coupled to a transmitter circuit and a receiver circuit. The isolation circuit can further isolate the transmitter circuit from received signals and isolate the receiver circuit from transmission signals. A non-reciprocal phase shifter may be used to shift a phase of a signal propagating along one of the circuit paths and further improve isolation of the transmitter circuit from received signals and the receiver circuit from transmission signals.

In some embodiments, the isolation circuit may include a balun (e.g., a transformer balun) that enables transmission signals to pass through to the transmitter circuit (e.g., via a transformer effect) and blocks the transmission signals from passing through to the receiver circuit, while enabling received signals to pass through to the receiver circuit (e.g., via circuit paths) and blocking the received signals from passing through to the transmitter circuit. In particular, the balun may receive an input signal (e.g., traveling in a first direction) and output two output signals of opposite polarities (e.g., being 180 degrees out of phase from one another), each having half the power of the input signal. For example, the balun may receive a transmission signal from the transmitter circuitry and output a first split transmission signal and a second split transmission signal, where the first and second split transmission signals are out of phase with one another by 180 degrees and each have half the power of the original transmission signal.

A phase shifter may be used on at least one of two circuit paths to phase shift at least one of the split transmission signals so that the two split transmission signals are in-phase (e.g., have a zero degree difference in phase). The phase shifter may include a non-reciprocal phase shifter which shifts a phase of a signal therethrough and improves isolation between the transmitter circuit and the receiver circuit. For example, the non-reciprocal phase shifter may shift a phase of a signal by one phase amount (e.g., +90 degrees) when the signal propagates through the non-reciprocal phase shifter in a first direction, but shifts a phase of a signal by another phase amount (e.g., −90 degrees) when the signal propagates through the non-reciprocal phase shifter in a second direction opposite of the first direction.

In some embodiments, the non-reciprocal phase shifter may be disposed on one of the two circuit paths and shift a phase of a portion of the split signal propagating therethrough. In that case, an additional phase shifter may be used to shift a phase of an additional portion of the split signal on the other circuit path opposite the non-reciprocal phase shifter. The additional phase shifter may be a bidirectional phase shifter and shift a phase of the signal therethrough by the same phase amount regardless of a direction of the signal. For example, the additional phase shifter may shift a phase of a signal therethrough by a third amount (e.g., +90 degrees) when the signal propagates through the additional phase shifter in the first direction and/or in the second direction.

As discussed above, the isolation circuit (e.g., balun) may split a transmission signal and combine a received signal. The split transmission signal from the transmitter circuit on the two circuit paths may be balanced. In that case, there is no voltage at the input of the receiver circuit, and, accordingly, no voltage from the transmission signal leaks into the receiver circuit.

The balun (e.g., isolation circuit) may also receive two input signals (e.g., traveling in the second direction) and output a combined output signal to the receive circuit. For example, the one or more antennas of the electronic device may receive a received signal from the one or more antennas and split the signal into two halves along the two circuit paths. The balun may receive the two split received signals and combine them to output a combined received signal having twice the bandwidth of the FDD transceiver.

When the received signal is received by the one or more antennas and split along the two circuit paths, the split received signals are in-phase. A phase of each of the split received signals may be shifted by the same amount by the non-reciprocal phase shifter on the first path and the bi-directional phase shifter on the second path. Thus, because a phase of each of the split received signals is shifted the same amount, the split received signals arrive at the isolation circuit in-phase. Thus, there is no differential signal at the isolation circuit and thus the received signals do not leak into the transmitter circuit. In this manner, the isolation circuit enables transmission signals to pass through to the transmitter circuit and block the transmission signals from passing through to the receiver circuit, while enabling received signals to pass through to the receiver circuit (e.g., via the circuit paths) and blocking the received signals from passing through to the transmitter circuit. Accordingly, the isolation circuit provides isolation between the transmitter circuit and the receiver circuit.

For a frequency division duplex (FDD) transceiver, the bandwidth of the received signal and the transmission signal may have been limited. That is, the available bandwidth for each of the transmission signal and the received signal for an FDD transceiver may have been limited to about 20 MHz. Instead, the disclosed embodiments may utilize a full-duplex transceiver that enables transmission and receipt of signals at the same frequency simultaneously having at least double the available bandwidth of the FDD transceiver.

Further, the balun and non-reciprocal phase shifter may enable a single cable to be used between integrated circuits for transmitting and receiving signals. That is, because the transmission and received signals are within the same frequency range, a first separate cable for the transmission signal corresponding to a first frequency range and a second separate cable for the receive signal corresponding to a second frequency range may be avoided.

In one embodiment, an electronic device for full duplex communications is provided. The electronic device includes one or more antennas coupled to a first signal path and a second signal path. The electronic device also includes a first balun coupling the first signal path to the second signal path. The electronic device also includes transmitter circuitry coupled to the first balun. The electronic device also includes receiver circuitry coupled to the first balun opposite the transmitter circuitry. The electronic device also includes a bidirectional phase shifter disposed on the first signal path. The electronic device also includes a non-reciprocal phase shifter disposed on the second signal path.

In another embodiment, an electronic device is provided which includes one or more antennas. The electronic device also includes a transmit circuit configured to transmit a transmission signal via the one or more antennas. The electronic device also includes a receive circuit configured to receive a receive signal via the one or more antennas. The electronic device also includes an isolation circuit coupled to the one or more antennas, the transmit circuit, and the receive circuit, the isolation circuit configured to isolate the transmit circuit from the receive signal and to isolate the receive circuit from the transmission signal, the isolation circuit configured to couple to the one or more antennas via a first signal path, and the isolation circuit configured to couple to the one or more antennas via a second signal path. The electronic device also includes a non-reciprocal phase shifter disposed on the first signal path and configured to shift a phase of at least a portion of the transmission signal therethrough by a first phase amount and configured to shift a phase of at least a portion of the receive signal therethrough by a second phase amount.

In yet another embodiment, an electronic device is provides which includes antenna means and means for transmitting a transmission signal via the antenna means. The electronic device also includes means for receiving a receive signal via the antenna means. The electronic device also includes means for isolating the transmitting means from the receive signal and for isolating the receiving means from the transmission signal, the isolating means coupled to a first signal path and a second signal path. The electronic device also includes means for shifting a phase of a first portion of the transmission signal on the first signal path to generate a shifted first portion of the transmission signal on the first signal path. The electronic device also includes means for shifting a phase of a second portion of the transmission signal on the second signal path to generate a shifted second portion of the transmission signal on the second signal path. The electronic device also includes means for constructively combining the shifted first portion of the transmission signal on the first signal path and the shifted second portion of the transmission signal on the second signal path into a combined signal.

BRIEF DESCRIPTION OF THE DRAWINGS

Various aspects of this disclosure may be better understood upon reading the following detailed description and upon reference to the drawings described below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Use of the term "approximately," "near," "about", and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Also, full-duplexing, as referred to herein, refers to transmitting and receiving wireless signals at the same time and over the same frequency range, as opposed to frequency division duplexing (FDD), where signals are transmitted over a first frequency range and received over a second frequency range different from the first frequency range.

Figure 1:
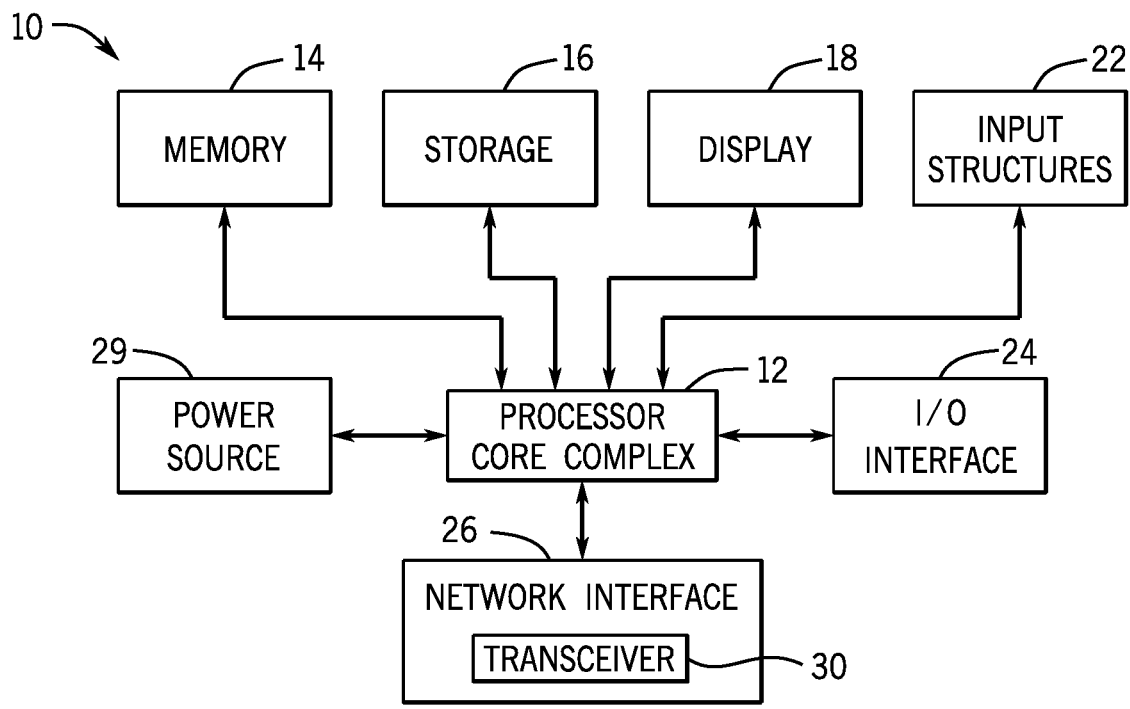
FIG. 1 is a block diagram of an electronic device, according to an embodiment of the present disclosure.

With the foregoing in mind, there are many suitable communication devices that may include and use the transceiver circuitry described herein. Turning first to FIG. 1, an electronic device 10 according to an embodiment of the present disclosure may include, among other things, a processor core complex 12 including one or more processor(s), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
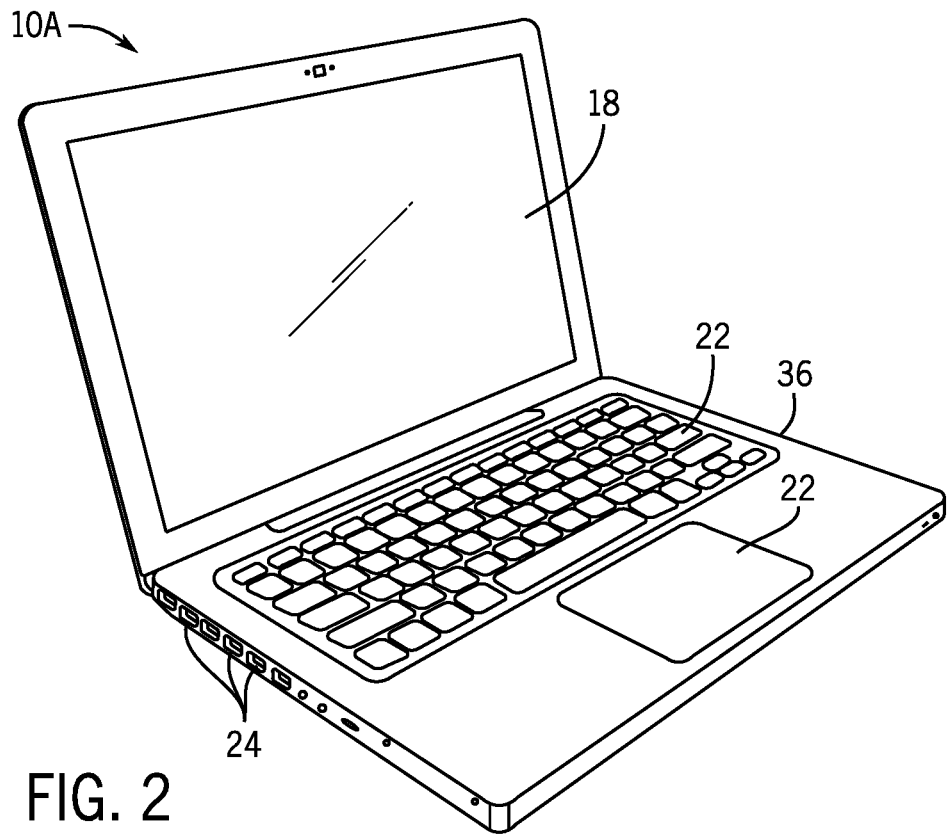
FIG. 2 is a perspective view of a notebook computer representing an embodiment of the electronic device of FIG. 1.
Figure 4:
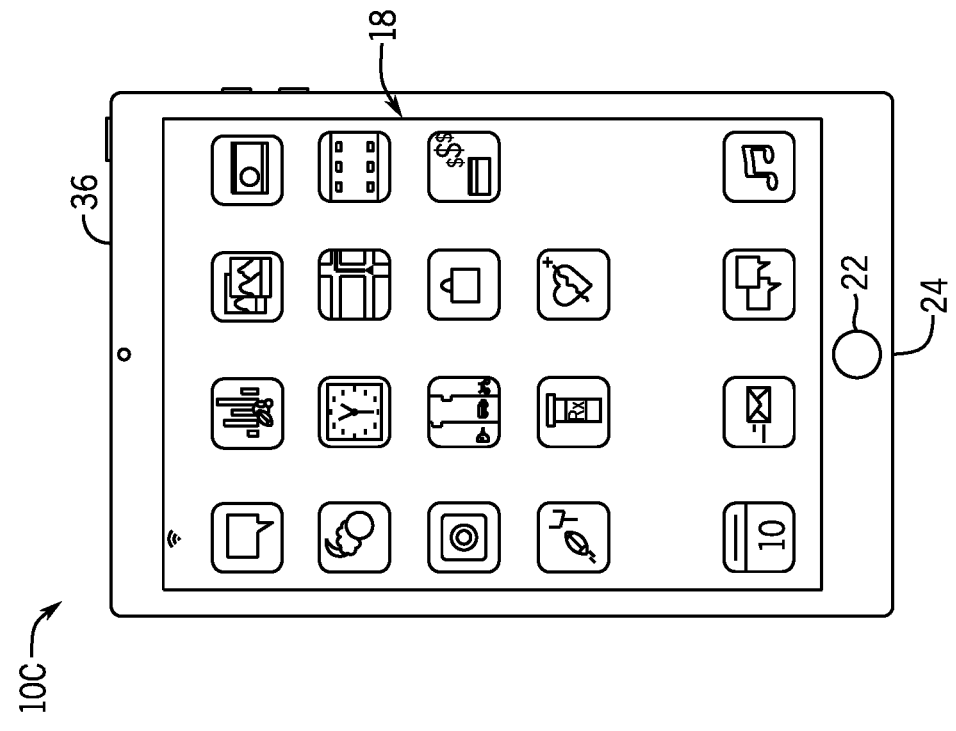
FIG. 4 is a front view of another handheld device representing another embodiment of the electronic device of FIG. 1.
Figure 3:
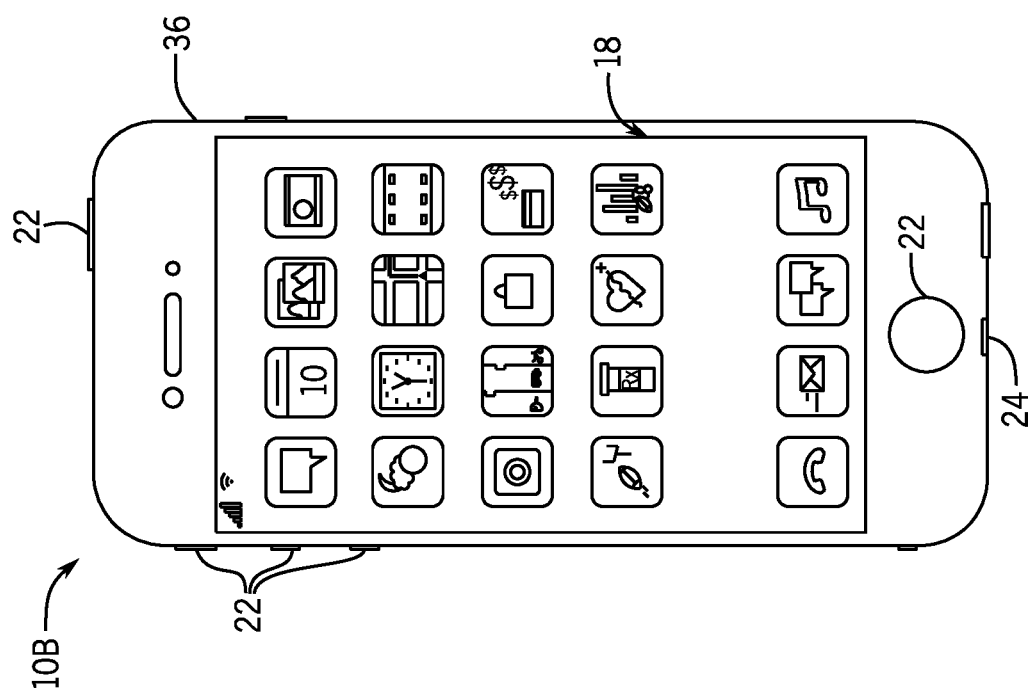
FIG. 3 is a front view of a handheld device representing another embodiment of the electronic device of FIG. 1.
Figure 5:
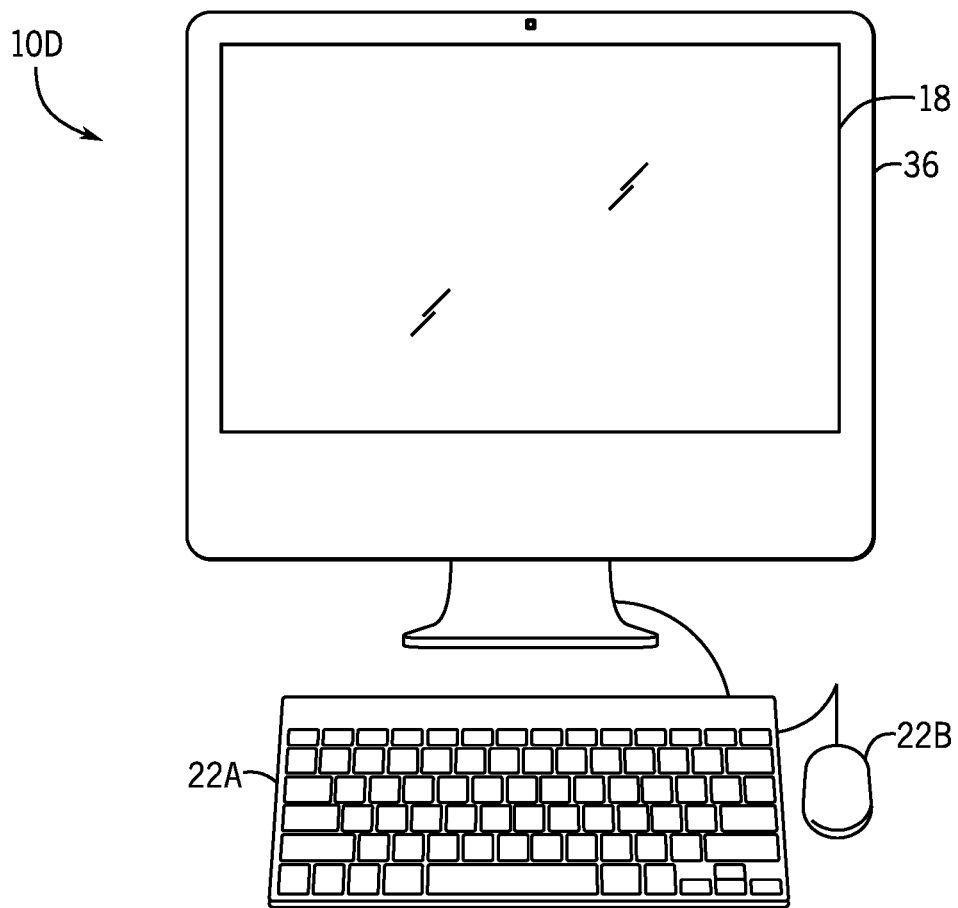
FIG. 5 is a front view of a desktop computer representing another embodiment of the electronic device of FIG. 1.
Figure 6:
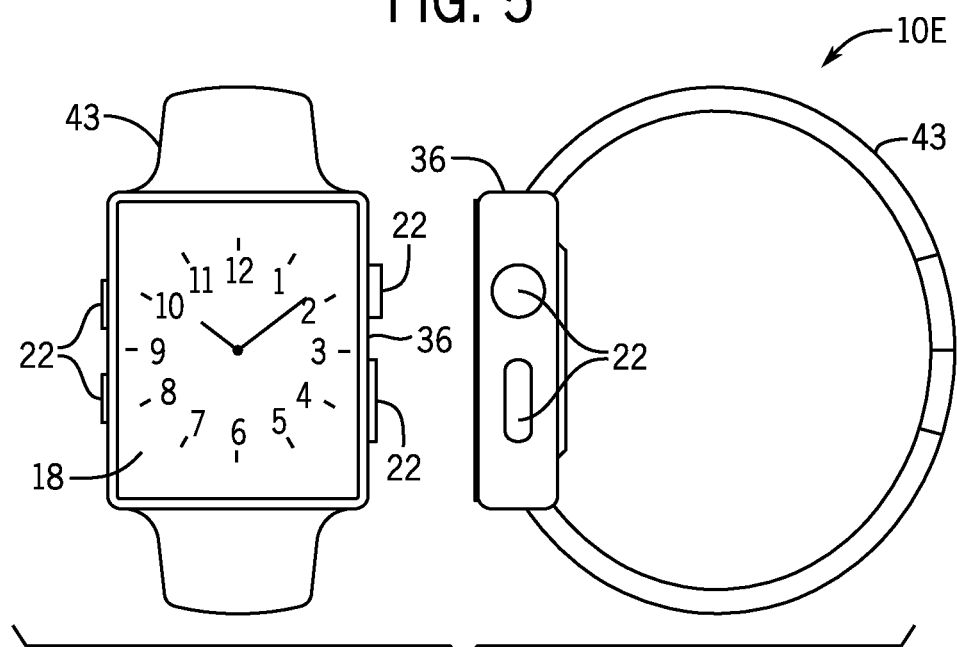
FIG. 6 is a perspective view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, software, hardware, or any combination thereof. Furthermore, the processor(s) 12 and other related items in FIG. 1 may be a single contained processing module or may be incorporated wholly or partially within any of the other elements within the electronic device 10.

In the electronic device 10 of FIG. 1, the processor(s) 12 may be operably coupled with a memory 14 and a nonvolatile storage 16 to perform various algorithms. Such programs or instructions executed by the processor(s) 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor (s) 12 to enable the electronic device 10 to provide various functionalities.

In certain embodiments, the display 18 may be a liquid crystal display (LCD), which may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as an 802.11x WI-FI® network, and/or for a wide area network (WAN), such as a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network. In particular, the network interface 26 may include, for example, one or more interfaces for using a Release-15 cellular communication standard of the 5G specifications that include the millimeter wave (mmWave) frequency range (e.g., 24.25-300 gigahertz (GHz)). The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor core complex 12. The transceiver 30 may support transmission and receipt of various wireless signals via one or more antennas (not shown in FIG. 1). In particular, the transceiver 30 may support simultaneous transmission and receipt of wireless signals at the same frequency or frequency range (e.g., full-duplex operation). As discussed in more detail below, the transceiver 30 may have a single I/O port for transmission and receipt of wireless signals. In some cases, changing impedance of the one or more antennas may disturb the duplex function and/or degrade isolation between the transmit path and the receive path. To prevent such disruption, an antenna tracker may be used to substantially match an impedance of the one or more antennas.

In particular, the transceiver 30 may include a duplexer (not shown in FIG. 1), such as an electrical balanced duplexer. The duplexer may enable bidirectional communication over a single path while separating signals traveling in each direction from one another. For example, the duplexer may isolate a transmitter of the electronic device 10 from a received signal and/or isolate a receiver of the electronic device 10 from a transmission signal (e.g., isolate the transmitter from the receiver, and vice versa). In some embodiments, the duplexer may include a balance-unbalance transformer (e.g., a balun) that performs or facilitates performing the isolation.

In some embodiments, the electronic device 10 communicates over various wireless networks (e.g., WI-FI®, WIMAX®, mobile WIMAX®, 4G, LTE®, 5G, and so forth) using the transceiver 30. The transceiver 30 may transmit and receive RF signals to support voice and/or data communication in wireless applications such as, for example, PAN networks (e.g., BLUETOOTH®), WLAN networks (e.g., 802.11x WI-FI®), WAN networks (e.g., 3G, 4G, 5G, NR, and LTE® and LTE-LAA cellular networks), WIMAX® networks, mobile WIMAX® networks, ADSL and VDSL networks, DVB-T® and DVB-H® networks, UWB networks, and so forth. The power source 29 of the electronic device 10 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may be generally portable (such as laptop, notebook, and tablet computers), or generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. of Cupertino, California. By way of example, the electronic device 10, taking the form of a notebook computer 10A, is illustrated in FIG. 2 in accordance with one embodiment of the present disclosure. The depicted notebook computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a graphical user interface (GUI) and/or applications running on computer 10A. For example, a keyboard and/or touchpad may allow a user to navigate a user interface and/or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, California. The handheld device 10B may include an enclosure 36 to protect interior components from physical damage and/or to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc. of Cupertino, California, a universal serial bus (USB), or other similar connector and protocol.

The input structures 22, in combination with the display 18, may allow a user to control the handheld device 10B. For example, the input structures 22 may activate or deactivate the handheld device 10B, navigate the user interface to a home screen, a user-configurable application screen, and/or activate a voice-recognition feature of the handheld device 10B. Other input structures 22 may provide volume control, or may toggle between vibrate and ring modes. The input structures 22 may also include a microphone that may obtain a user's voice for various voice-related features, and a speaker that may enable audio playback and/or certain phone capabilities. The input structures 22 may also include a headphone input that may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, California.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or another similar device by Apple Inc. of Cupertino, California. It should be noted that the computer 10D may also represent a personal computer (PC) by another manufacturer. A similar enclosure 36 may be provided to protect and enclose internal components of the computer 10D, such as the display 18. In certain embodiments, a user of the computer 10D may interact with the computer 10D using various peripheral input structures 22, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may operate using the techniques described herein. By way of example, the wearable electronic device 10E, which may include a wristband 43, may be an Apple Watch® by Apple Inc. of Cupertino, California. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, LED display, OLED display, active-matrix organic light emitting diode (AMOLED) display, and so forth), as well as input structures 22, which may allow users to interact with a user interface of the wearable electronic device 10E.

As mentioned above, the transceiver 30 of the electronic device 10 may include a transmitter and a receiver that are coupled to an antenna to enable the electronic device 10 to transmit and receive wireless signals. Certain electronic devices may include isolation circuitry having an electrical balanced duplexer (EBD) that isolates the transmitter from received signals, and the receiver from transmission signals, thus reducing interference when communicating. In such electronic devices, an impedance tuner may be used to match the impedance of the antenna to increase effectiveness of this isolation. However, the available bandwidth for transmitting and receiving signals may be limited by a half-duplex transceiver. As a result, transmission of signals between integrated circuits of the electronic device 10 and wireless communications with external devices may be slow. Further, separate cables may be needed to transmit and receive signals at the same frequency using a half-duplex transceiver. The additional cable consumes additional space or real estate on the integrated circuit and thus limits a minimum size of the integrated circuit.

Thus, the transceiver 30 of the electronic device 10 may be a full-duplex transceiver to double the available bandwidth for transmitting and receiving signals at the same frequency simultaneously.

transmission path for transmission signals sent from the transmitter may branch between the antenna and the impedance tuner. As a result, some of the power used to transmit a transmission signal through the antenna may be lost when the transmission signal branches to the impedance tuner. Similarly, the reception path for received signals received from the antenna may branch between the receiver and the impedance tuner. As a result, some of the power in the received signal received at the receiver may be lost (e.g., insertion loss) when the received signal branches to the impedance tuner.

Embodiments herein provide various apparatuses and techniques to improve available bandwidth for the transmission and received signals while maintaining and/or improving isolation of the transmitter and receiver of the electronic device 10. To do so, the embodiments disclosed herein include a full duplex transceiver (e.g., one that enables transmitting and receiving wireless signals at the same time and over the same frequency range) with two circuit paths between one or more antennas and an isolation circuit. A non-reciprocal phase shifter may be disposed on one of the two circuit paths to shift a phase of a signal therethrough such that the signal through the phase shifter can be constructively combined with a signal on the other circuit path. For example, the non-reciprocal phase shifter may shift a phase of a signal by one phase amount (e.g., +90 degrees) when the signal propagates through the non-reciprocal phase shifter in a first direction, and shift a phase of a signal by another phase amount (e.g., −90 degrees) when the signal propagates through the non-reciprocal phase shifter in a second direction, opposite of the first direction. While phases of the signals may be discussed herein with respect to degrees, it should be understood that alternative angular units of measure may be used, such as radians. For example, 90 degrees of phase shift may be equivalent to about 1.5708 radians of phase shift.

In some embodiments, the non-reciprocal phase shifter may be disposed on one of the two circuit paths and shift a phase of a portion of the split signal propagating therethrough. The non-reciprocal phase shifter may improve the isolation of the transmitter and the receiver of the electronic device 10 (e.g., by ensuring that the signal on its circuit path is in-phase with the signal on the other circuit path).

Figure 7:
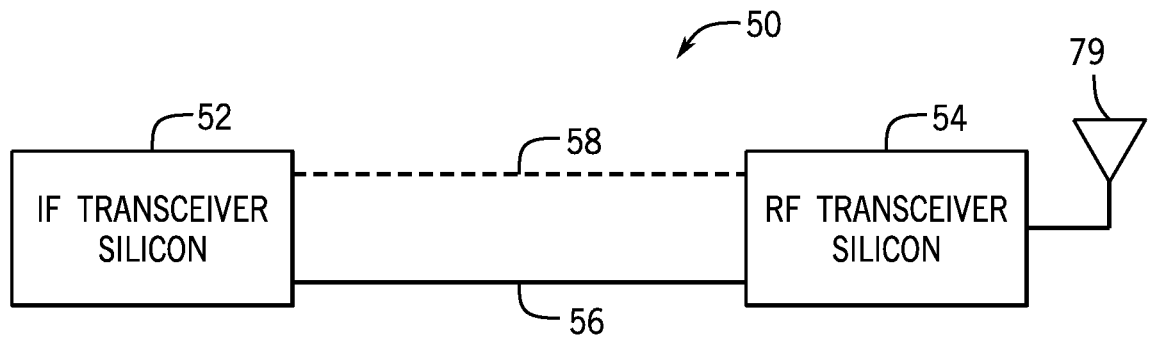
FIG. 7 is an example block diagram of a communication system of the electronic device of FIG. 1, according to an embodiment of the present disclosure.

With the foregoing in mind, FIG. 7 is an example block diagram of a communication system 50 of the electronic device of FIG. 1, according to an embodiment of the present disclosure. The communication system 50 includes a first integrated circuit (IC) 52 coupled to a second IC 54. The ICs 52, 54 may represent various ICs in electronic device 10 discussed with respect to FIG. 1. One or more antennas 79 may be coupled to the second IC 54 to wirelessly transmit and receive signals. As illustrated, the first IC 52 is an intermediate frequency (IF) transceiver silicon IC and the second IC 54 is a radio frequency (RF) transceiver silicon IC. In some embodiments, the first IC 52 may be used to transmit electronic signals (e.g., data) between various ICs in the electronic device 10. Additionally or alternatively, the first IC 52 may include a baseband silicon IC which may manage functions of the second IC 54 (and other ICs of the electronic device 10), such as transmission and receipt of wireless signals via the one or more antennas 79. In some embodiments, the second IC 54 may transmit and receive various wireless signals via the one or more antennas 79. The signals transmitted and received by the second IC 54 may be in a frequency suitable for wireless communication, for example, in the range of 3 kHz-300 GHz.

In the case of a frequency division duplex (FDD) transceiver, where signals are transmitted over a first frequency range and received over a second frequency range, the first IC 52 may be coupled to the second IC 54 via a first path 56 and a second path 58. The first path 56 may be used to transmit signals from the first IC 52 to the second IC 54 to be transmitted via one or more antennas 79. The second path 58 may be used to transmit signals received by the one or more antennas 79 from the second IC 54 to the first IC 52.

That is, the paths 56, 58 may be unidirectional. However, the two paths 56, 58 between the ICs 52, 54 may takes up valuable space in the electronic device 10 or prevent incorporating additional circuitry in the electronic device 10.

Embodiments described herein enable removal of one of the paths 56, 58 between the ICs 52, 54. That is, a single path 56 may be used to send signals between the first IC 52 and the second IC 54, regardless of a direction of the signal, as transmission and received signals may share the same frequency range. That is, the signals on the single path may include transmission signals to be transmitted via the one or more antennas 79 and signals received via the one or more antennas 79. By reducing a number of paths between the ICs 52, 54, a size of a footprint of the circuitry of the in the electronic device 10 may also be reduced, and/or additional circuitry may be incorporated in the electronic device 10.

Figure 8:
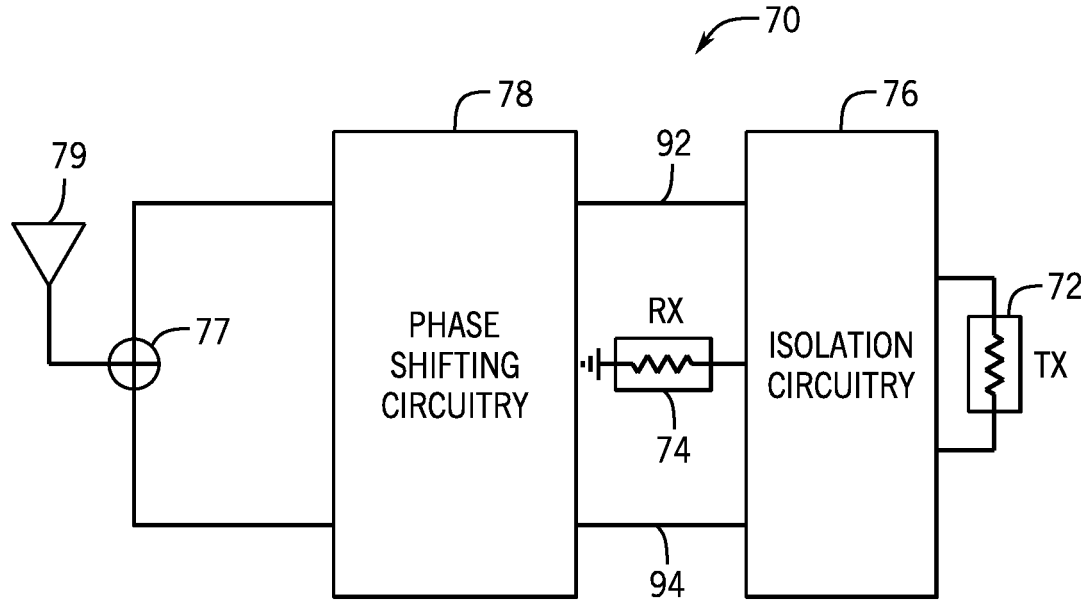
FIG. 8 is a schematic diagram of an example transceiver circuitry of the electronic device of FIG. 1, according to an embodiment of the present disclosure.

FIG. 8 is a schematic diagram of example transceiver circuitry 70 of the electronic device 10, according to an embodiment of the present disclosure. In some embodiments, the example transceiver circuitry 70 may be disposed in the transceiver 30 discussed with respect to FIG. 1. In other embodiments, the transceiver circuitry 70 may be disposed in the network interface 26 and coupled to the transceiver 30. With respect to FIG. 7, the transceiver circuitry 70 may be disposed in one or both of the ICs 52, 54.

As illustrated, the transceiver circuitry 70 includes isolation circuit 76 disposed between a transmit (TX) circuit 72 and a receive (RX) circuit 74. The isolation circuit 76 is coupled to the TX circuit 72 and is coupled to the RX circuit 74. The isolation circuit 76 may enable transmission signals to pass through to the TX circuit 72 (e.g., via a transformer effect) and block the transmission signals from passing through to the RX circuit 74, while enabling received signals to pass through to the RX circuit 74 (e.g., via circuit paths) and blocking the received signals from passing through to the TX circuit 72.

The first path 92 and the second path 94 each couple the isolation circuit 76 to one or more antennas 79 via a node 77. The first path 92 may be parallel to and opposite the second path 94. The first path 92 and the second path 94 may be bidirectional paths along which a signal to be transmitted (e.g., a TX signal) splits and travels from the TX circuit 72 to the one or more antennas 79. Similarly, a signal received via the one or more antennas 79 (e.g., an RX signal) may split and travel along the first path 92 and the second path 94 to the RX circuit 74.

In some embodiments, the TX signal from the TX circuit 72 may be divided by the isolation circuit 76. In that case, a first portion of the TX signal may propagate along the first path 92 and a second portion of the TX signal may propagate along the second path 94. The first portion of the signal and the second portion of the signal may be combined at the node 77. Similarly, a signal received via the one or more antennas 79 may be split into a first portion of the RX signal and a second portion of the RX signal. The first portion of the RX signal may propagate along the first path 92 and the second portion of the RX signal may propagate along the second path 94. The first and second portions of the RX signal may be combined at the isolation circuit 76 and provided to the RX circuit 74. It should be noted that splitting the TX signal at the isolation circuit from the TX circuit 72 or the RX signal at the node 77 from the one or more antennas 79, without combining the split signals back together, may cause an insertion loss equal to about half of a power of the TX signal output from the TX circuit 72 or about half of a power of the RX signal output from the one or more antennas 79, respectively. In some embodiments, the insertion loss may be about 3 decibels (dB).

The isolation circuit 76 may include a balun (e.g., a transformer balun) that enables TX signals to pass through to the TX circuit 72 (e.g., via a transformer effect) and blocks the TX signals from passing through to the RX circuit 74, while enabling RX signals to pass through to the RX circuit 74 (e.g., via circuit paths) and blocking the RX signals from passing through to the TX circuit 72. In particular, the balun of the isolation circuit 76 may receive a TX signal from the TX circuit 72, and output a first split TX signal on the first path 92 and a second split TX signal on the second path 94, where the first and second split TX signals are out of phase with one another (e.g., by approximately 180 degrees). Each of the split TX signals may have half the power of the original TX signal. The split TX signal from the TX circuit 72 on the first path 92 and the second path 94 may be balanced. Thus, there is no voltage at the input of the RX circuit 74, and, accordingly, no voltage from the TX signal leaks into the RX circuit 74. Similarly, when an RX signal is received by the one or more antennas 79 and split at the node 77, the split RX signals are in-phase. Thus, there is no differential signal at the isolation circuit 76 and thus the RX signals do not leak into the TX circuit 72. In this manner, the isolation circuit 76 enables TX signals to pass through to the TX circuit 72 and block the TX signals from passing through to the RX circuit 74, while enabling received signals to pass through to the RX circuit 74 (e.g., via circuit paths) and blocking the received signals from passing through to the TX circuit 72.

Because the split TX signals are out of phase, the disclosed embodiments include phase shifting circuit 78 that may be disposed along the first path 92 and/or the second path 94. Moreover, the phase shifting circuit 78 is coupled to the isolation circuit 76 via the first path 92 and/or the second signal path 94. The phase shifting circuit 78 is coupled to the one or more antennas 79 via the first path 92 and/or the second path 94, and the node 77. Specifically, the phase shifting circuit 78 may include one or more phase shifters disposed along the first path 92 and/or the second path 94.

The phase shifting circuit 78 may shift a phase of a signal along a respective path 92, 94 to substantially correlate or match a phase of a signal along the other path 92, 94, in either direction (e.g., for both TX and RX signals). For example, because the phase of the first portion of the TX signal on the first path 92 may be about 180 degrees out of phase compared to the second portion of the TX signal on the second path 94, in some embodiments, the phase shifting circuit 78 may shift a phase of the first portion of the TX signal on the first path 92 by about 180 degrees. After the phase of the first portion of the TX signal is shifted by the phase shifting circuit 78, the phase-shifted first portion and the second portion of the TX signal are substantially in-phase with each other. Thus, the phase shifting circuit 78 may shift a phase of a signal along the first path 92, but not the second path 94.

In other embodiments, the phase shifting circuit 78 may shift a phase of a signal along both the first path 92 and the second path 94. For example, the phase shift of the first signal on the first path 92 may be opposite the phase shift of the second signal on the second path 94. That is, the phase shifting circuit 78 may shift the phase of the first signal on the first path 92 by +90 degrees, and shift the phase of the second signal on the second path 94 by −90 degrees. As another example, if the phase shifting circuit 78 may shift the phase of the first signal on the first path 92 by +100 degrees, and shift the phase of the second signal on the second path 94 by −80 degrees. In any case, the phase shifting circuit 78 may shift the phase of the first and second signals to enable the split signals to be constructively combined.

Without the phase shifting circuit 78, the first signal on the first path 92 and the second signal on the second path 94 may be out-of-phase. If the first signal on the first path 92 and the second signal on the second path 94 were combined without placing the signals in-phase, an amplitude of the combined signal may be reduced compared to the original signal from the TX circuit 72 or the one or more antennas 79. As such, an insertion loss caused by the isolation circuit 76 might be amplified without placing the signals in-phase.

Shifting a phase of the first portion of the TX signal on the first path 92 enables that signal to be combined with a second portion of the TX signal on the second path 94. Thus, the two signals along the respective paths 92, 94 can be constructively combined at the node 77 prior to propagate to the one or more antennas 79 to recover power lost in the TX signal due to splitting from the isolation circuit 76.

As illustrated, the node 77 is in the form of a "T-line" junction (e.g., three circuit paths joined together at the node 77). In additional or alternative embodiments, the node 77 may include a combiner circuit or device, such as a balun, a Wilkinson power divider, a capacitor, or the like. As such, the phase shifting circuit 78 may be deactivated for RX signals, and thus be a unidirectional phase shifter. In other embodiments, the node 77 may cause a phase difference (e.g., approximately a 180 degree phase difference) between the first portion of the RX signal traveling along the first path 92 and the second portion of the RX signal traveling along the second path 94, and, as such, the phase shifting circuit 78 may be bidirectional and shift a phase of the first portion of the RX signal traveling along the first path 92 and/or the second portion of the RX signal traveling along the second path 94 to ensure that the portions of the RX signal are in-phase. In such cases, the node 77 may include, for example, a balun, which may cause the phase difference between the two portions of the RX signal.

The node 77 may combine the shifted signals from the phase shifting circuit 78 and provide the combined signal to the one or more antennas 79 to be transmitted therefrom. The node 77 may be any RF combiner circuit, such as a balun, a Wilkinson power divider, a capacitor, a T-line junction, and the like. Depending on the type of combiner circuit used at the node 77, the combiner circuit may shift a phase of a portion of a signal received by the one or more antennas 79. For example, a signal received at the one or more antennas 79 may be split into a first portion propagated along the first path 92 and a second portion propagated along the second path 94. However, the combiner circuit at the node 77 may shift a phase of at least one of the first portion and the second portion. Such is the case if the combiner circuit is implemented as a balun (e.g., a transformer balun). In that case, the phase shifting circuit 78 may shift a phase of at least one of the first portion and the second portion of the received signal, such that the first portion of the signal is in-phase with the second portion of the signal at the isolation circuit 76. To enable the first portion of the signal to be in-phase with the second portion of the signal at the isolation circuit 76, the phase shifting circuit 78 may provide bidirectional phase shifting to shift an RX signal propagating from the one or more antennas 79 to the isolation circuit 76, as well as a TX signal propagating from the isolation circuit 76 to the one or more antennas 79. The first portion and the second portion are then combined at the isolation circuit 76 and provided to the RX circuit 74.

Similarly, the first portion of an RX signal on the first path 92 may be combined with the second portion of the RX signal on the second path 94 at the isolation circuit 76. The RX signal received at the one or more antennas 79 may be in single-ended mode. Thus, the first portion of the RX signal on the first path 92 is in-phase with the second portion of the RX signal on the second path 94.

Figure 9A:
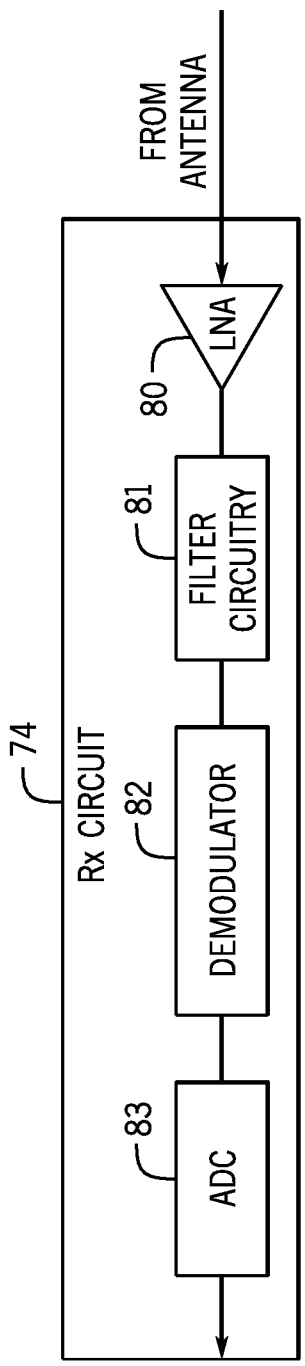
FIG. 9A is a schematic diagram of a receive circuit of the example transceiver circuitry of FIG. 7, according to an embodiment of the present disclosure.

FIG. 9A is a schematic diagram of a receive circuit (e.g., the RX circuit) 74 of the example transceiver circuitry of FIG. 7, according to an embodiment of the present disclosure. As illustrated, the RX circuit 74 may include, for example, a low noise amplifier (LNA) 80, filter circuitry 81, a demodulator 82, and an analog-to-digital converter (ADC) 83. One or more signals received by the one or more antennas 79 may be sent to the RX circuit 74 via the isolation circuit 76. In some embodiments, the RX circuit 74 may include components in addition to or alternative to the LNA 80, filter circuitry 81, the demodulator 82, and the ADC, 83, such as a mixer, a digital down converter, and the like.

The LNA 80 and filter circuitry 81 may receive the combined RX signal (e.g., the first and the second portions of the RX signal) received by the one or more antennas 79 and combined by the isolation circuit 76. The LNA 80 may amplify the combined RX signal to a suitable level for the rest of the circuitry to process.

The filter circuitry 81 may include one or more types of filters such as bandpass filter, a low pass filter, or a decimation filter, or any combination thereof. The filter circuitry 81 may remove undesired noise from the RX signal, such as cross-channel interference. The filter circuitry 81 may also remove additional signals received by the one or more antennas 79 which are at frequencies other than the desired signal.

The filtered RX signal is sent to the demodulator 82. The demodulator 82 may remove the RF envelope and extract a demodulated signal from the filtered RX signal for processing. The ADC 83 receives the demodulated analog signal and converts the signal to a digital signal so that it can be further processed by the electronic device 10.

Figure 9B:
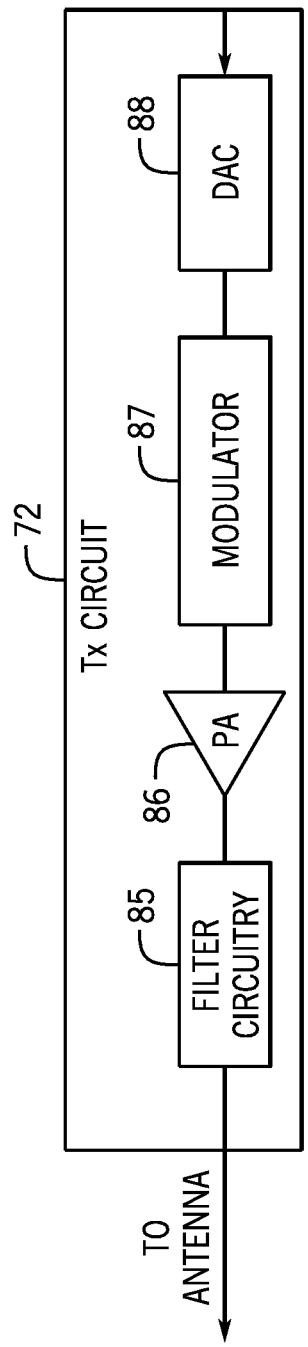
FIG. 9B is a schematic diagram of a transmission circuit of the example transceiver circuitry of FIG. 7, according to an embodiment of the present disclosure.

FIG. 9B is a schematic diagram of a transmission circuit (e.g., the TX circuit) 72, according to an embodiment of the present disclosure. As illustrated, the TX circuit 72 may include, for example, filter circuitry 85, a power amplifier (PA) 86, a modulator 87, and a digital-to-analog converter (DAC) 88. In some embodiments, the TX circuit 72 may include components in addition to or alternative to the filter circuitry 85, the PA 86, the modulator 87, and the DAC 88 such as a digital up converter, etc.

A digital signal containing information to be transmitted via the one or more antennas 79 is provided to the DAC 88. The DAC 88 converts the digital signal to an analog signal. The modulator 87 may combine the converted analog signal with a carrier signal to generate a radio wave.

The PA 86 receives signal the modulated signal from the modulator 87. The PA 86 amplifies the modulated signal to a suitable level to drive transmission of the signal via the one or more antennas 79. Similar to the filter circuitry 81, the filter circuitry 85 of the TX circuit 72 may remove undesirable noise from the amplified signal to be transmitted via the one or more antennas 79. In some embodiments, a PA, such as the PA 86, may be disposed within the transmitter in addition to or alternative to the PA 86 in the TX circuit 72.

Figure 10A:
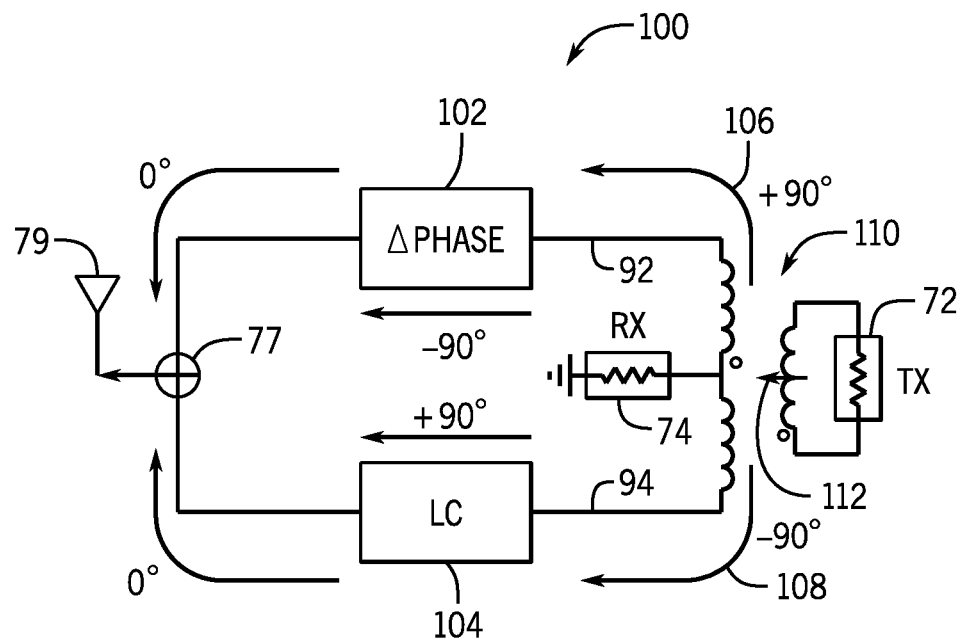
FIG. 10A is a schematic diagram of example transceiver circuitry of the electronic device of FIG. 1 illustrating a path of a transmission (TX) signal, according to an embodiment of the present disclosure.

FIG. 10A is a schematic diagram of example transceiver circuitry 100 of the electronic device of FIG. 1 illustrating a path of a transmission (TX) signal, according to an embodiment of the present disclosure. The example transceiver circuitry 100 is substantially similar to the schematic diagram of the transceiver circuitry 70 in FIG. 8, with the phase shifting circuitry 78 including a first phase shifter 102 on the first path 92 and a second phase shifter 104 on the second path 94. A TX signal 112 is depicted as propagating through the transceiver circuitry 70 along example paths 106, 108. The isolation circuit 76 is represented by a balun 110. Although not shown, an impedance matching circuit (e.g., an antenna tracker) discussed with respect to FIG. 10C may be included in the transceiver circuitry 100 to improve isolation between the RX circuit 74 and the TX circuit 72.

As discussed above, the TX signal 112 is provided to the balun 110 by the TX circuit 72 to be transmitted via the one or more antennas 79. In addition to preventing an RX signal from entering the TX circuit 72, the balun 110 also splits the TX signal 112 into a first portion (+TX) 106 and a second portion (−TX) 108. The first portion (+TX) 106 propagates along the first path 92 and the second portion (−TX) 108 propagates along the second path 94.

As discussed above, a phase of the first portion (+TX) 106 may be out of phase from the second portion (−TX) 108 due to the balun 110. Thus, the phase shifters 102, 104 shift a phase of the respective portions of the TX signal 112 such that the first portion (+TX) 106 and the second portion (−TX) 108 are substantially in-phase at the node 77. As discussed above, in some embodiments, one or both phases of the first and second portions 106, 108 may be shifted as long as the phases of the respective portions are substantially in-phase at the node 77. Shifting a phase of the one or both of the portions 106, 108 enables the portions 106, 108 to be constructively combined at the node 77, thereby reducing or substantially eliminating the insertion loss caused by the isolation circuit.

In some embodiments, the phase shifter 102 on the first path 92 may be a non-reciprocal phase shifter, as discussed with respect to FIG. 11 below. As such, the phase shifter 102 may be a bidirectional phase shifter and shift a phase of a signal from the isolation circuit 76 (e.g., the balun 110) to the antenna 79 by a first phase amount and shift a phase of a signal from the antenna 79 to the isolation circuit 76 by a second phase amount. In some embodiments, the phase shift by the phase shifter 102 of a portion of the TX signal from the TX circuit 72 to the antenna 79 may be opposite a phase shift by the phase shifter 102 of a portion of the RX signal from the antenna 79 to the RX circuit 74. For example, as illustrated, the phase shifter 102 may shift a phase of the TX signal therethrough by −90 degrees while the phase shifter 102 may shift a phase of the RX signal therethrough by +90 degrees.

The phase shifter 104 on the second path 94 may also be a bidirectional phase shifter that is reciprocal, and thus shift a phase of the signal therethrough by the same phase amount regardless of a direction of the signal. For example, the phase shifter 104 may shift a phase of a signal from the antenna 79 to the isolation circuit 76 and from the isolation circuit 76 to the antenna 79 by the same amount. In some embodiments, the phase shifter 104 may shift a signal therethrough by +90 degrees. Thus, the amount of phase shift provided by the phase shifter 104 may be a fixed amount based on a phase shift caused by the isolation circuit 76 and/or the combiner circuit at the node 77.

In particular, the balun 110, in splitting the TX signal 112 between the first path 92 and the second path 94, shifts a phase of the first portion 106 of the TX signal 112 along the first path 92 by +90 degrees and shifts a phase of the second portion 108 of the TX signal 112 by −90 degrees. The non-reciprocal phase shifter 102 shifts a phase of the first portion 106 of the TX signal 112 by −90 degrees, resulting in the first portion 106 of the TX signal 112 being shifted by 0 degrees. Thus, the non-reciprocal phase shifter 102 counteracts the phase shift of the first portion 106 of the TX signal 112 caused by the balun 110. Similarly, the phase shifter 104 shifts a phase of the second portion 108 of the TX signal 112 by +90 degrees, resulting in the second portion 108 of the TX signal 112 being shifted by 0 degrees, thus counteracting the phase shift of the second portion 108 caused by the balun 110. In that case, the shifted first portion 106 of the TX signal 112 on the first path 92 and the shifted second portion 108 of the TX signal 112 on the second path 94 are in-phase (e.g., both being shifted by 0 degrees), and can be constructively combined at the node 77 and transmitted via the one or more antennas 79. In this manner, the phase shifters 102, 104 enable constructive combination of the first portion 106 of the TX signal 112 and the second portion 108 of the TX signal 112.

Advantageously, the non-reciprocal phase shifter 102 may improve the isolation between the TX circuit 72 and the RX circuit 74 by accurately balancing the portions 106, 108 of the TX signal 112, resulting in zero voltage at the input of the RX circuit 74, thus preventing voltage from the TX signal 112 from leaking to the RX circuit 74. Further, the non-reciprocal phase shifter 102 in combination with the phase shifter 104 enable the signals on the first path 92 and the second path 94 to be constructively combined at the node 77 and transmitted via the one or more antennas 79, thereby reducing or substantially eliminating the insertion loss caused by the isolation circuit 76 (e.g., the balun 110).

Figure 10B:
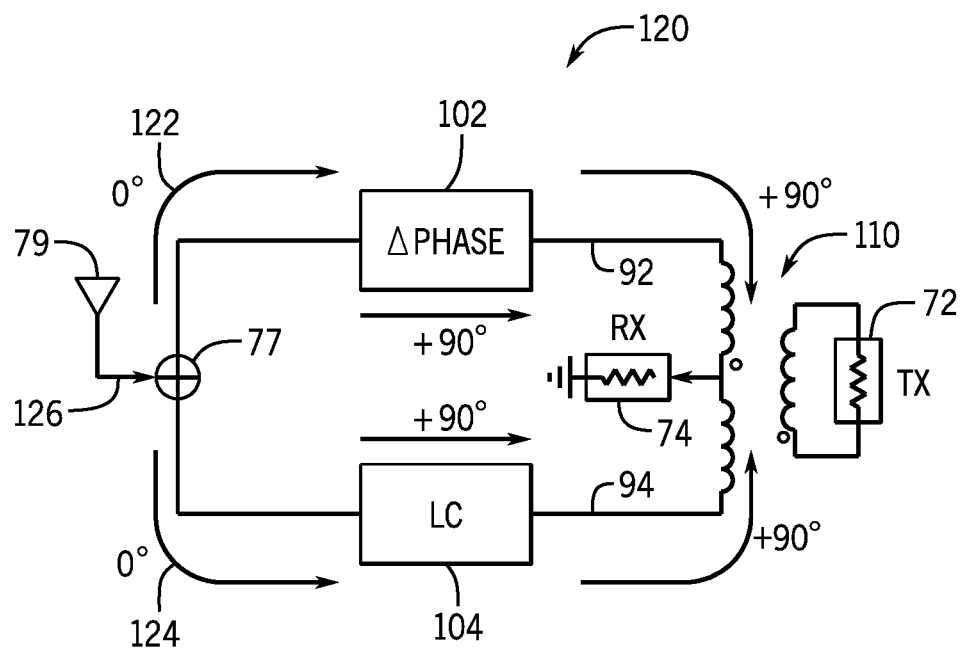
FIG. 10B is a schematic diagram of example transceiver circuitry of the electronic device of FIG. 1 illustrating a path of a received (RX) signal, according to an embodiment of the present disclosure.

FIG. 10B is a schematic diagram of an example transceiver circuitry 120 of the electronic device 10 illustrating a path of a received (RX) signal, according to an embodiment of the present disclosure. The transceiver circuitry 120 is substantially similar to the schematic diagram of the transceiver circuitry 100 in FIG. 10A. An RX signal 126 is depicted as propagating through the transceiver circuitry 120 along example paths 122, 124. Although not shown, an impedance matching circuit (e.g., an antenna tracker) discussed with respect to FIG. 10C may be included in the transceiver circuitry 120 to improve isolation between the RX circuit 74 and the TX circuit 72.

As discussed above, the RX signal 126 is received via the antenna 79 and propagates through the transceiver circuitry 120 via the example paths 122, 124 to the RX circuit 74. The RX signal 126 is split into a first portion 122 and a second portion 124 at the node 77. The first portion 122 propagates along the first path 92 and the second portion 124 propagates along the second path 94. The node 77 may not cause a phase shift of either the first portion 122 or the second portion 124 of the RX signal 126. However, the phase shifters 102, 104 shift a phase of a respective portion 122, 124 of the RX signal 126, such that the shifted first portion 122 and the shifted second portion 124 are in-phase and can be constructively combined by the balun 110.

In particular, the first portion 122 of the RX signal 126 propagates along the first path 92 to the phase shifter 102 and the second portion 124 of the RX signal 126 propagates along the second path 94 to the phase shifter 104. The phase shifter 104 shifts a phase of the first portion 122 of the RX signal 126 by +90 degrees. Similarly, the phase shifter 102 shifts a phase of the second portion 124 of the RX signal 126 by +90 degrees. Thus, the shifted first portion 122 and the shifted second portion 124 of the RX signal 126 are in-phase (e.g., a phase of the portions 122, 124 of the RX signal +90 degrees) and can be constructively combined by the balun 110. That is, the phase shifters 102, 104 enable the first portion 122 and the second portion 124 of the RX signal 126 to be constructively combined.

Figure 10C:
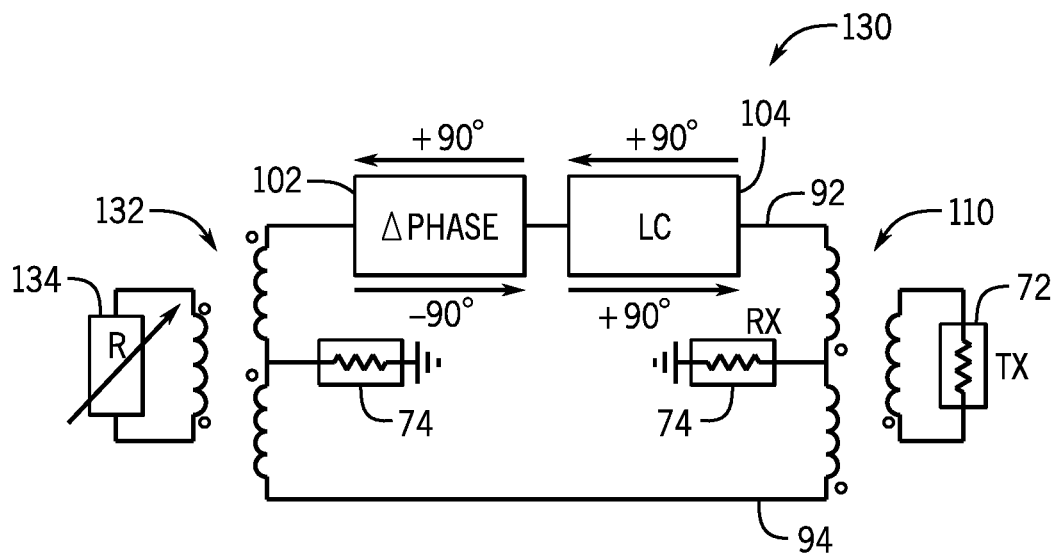
FIG. 10C is a schematic diagram of example transceiver circuitry of the electronic device of FIG. 1, according to an embodiment of the present disclosure.

FIG. 10C is a schematic diagram of an example transceiver circuitry 130 of the electronic device of FIG. 1, according to an embodiment of the present disclosure. The transceiver circuitry 130 is substantially similar to the schematic diagram of the transceiver circuitry 70 in FIG. 8 with a first balun 110 for the isolation circuitry 76 and a combiner circuit (e.g., a second balun) 132 in place of the node 77. As depicted, the transceiver circuitry 130 includes the phase shifters 102, 104 disposed on the first path 92. The transceiver circuitry 130 also includes an impedance matching circuit 134 coupled to a second balun 132 at the antenna 79.

As discussed above, the first balun 110 improves isolation between the TX circuit 72 and the RX circuit 74. Similarly, the second balun 132 may improve isolation between the one or more antennas 79 and the impedance matching circuit 134. The phase shifters 102, 104 are disposed in series on the first path 92 between the first balun 110 and the second balun 132. Thus, the second phase shifter 104 shifts a phase of the signal therethrough by +90 degrees, regardless of a direction of the signal. The phase shift of the first phase shifter 102 may be dependent on the direction of the signal therethrough. For example, the phase shifter 102 shifts a phase of a signal propagating from the first balun 110 to the balun 132 by +90 degrees, while the phase shifter 102 shifts a phase of a signal propagating from the second balun 132 to the first balun 110 by −90 degrees.

Accordingly, a TX signal from the TX circuit may be split by the first balun 110 into a first portion along the first path 92 and a second portion along the second path 94. The balun causes a phase of the first portion of the TX signal along the first path 92 to be shifted +90 degrees and a phase of the second portion of the TX signal along the second path 94 to be shifted −90 degrees. The phase shifter 104 shifts a phase of the first portion of the TX signal by +90 degrees, generating a shifted first portion of the TX signal with a phase of +180 degrees. The phase shifter 102 shifts a phase of the first portion of the TX signal by an additional +90 degrees, generating a shifted first portion of the TX portion with a phase of +270 degrees. That is, the shifted first portion of the TX signal output by the phase shifter 102 is in-phase with the second portion of the TX signal along the second path 94, since a phase of −90 degrees and a phase of +270 degrees are equivalent. Thus, the phase shifters 102, 104 enable the shifted first portion and the second portion of the TX signal to be constructively combined by the second balun 132 and transmitted via the one or more antennas 79.

Similarly, the second balun 132 splits an RX signal received via the one or more antennas 79 into a first portion along the first path 92 and a second portion along the second path 94. A phase of the first and second portions of the RX signal is not shifted at the second balun 132 because the portions of the RX signal are not affected by the transformer effect. That is, the phase of the first and second portions of the RX signal are 0 (zero) degrees. The phase shifter 102 shifts a phase of the first portion of the RX signal by −90 degrees and the phase shifter 104 shifts a phase of the first portion of the RX signal by +90 degrees, resulting in a phase shift to the first portion of the RX signal of 0 degrees. Thus, the phase shift provided by the phase shifter 104 counteracts the phase shift provided by the phase shifter 102. Accordingly, the first portion of the RX signal along the first path 92 and the second portion of the RX signal along the second path 94 are in-phase at the first balun 110 (e.g., being both shifted by 0 degrees) and are constructively combined thereby. That is, the phase shifters 102, 104 enable the first and second portions of the RX signal to be constructively combined via the first balun 110.

The impedance matching circuit 134 has an adjustable impedance to offset an imbalance between an impedance of the one or more antennas 79 and an impedance of the isolation circuit 76. That is, the impedance matching circuit 134 may be adjusted to offset a change of an impedance of the one or more antennas 79. For example, if the impedance of the one or more antennas 79 changes, an impedance mismatch condition may occur because the impedance of the one or more antennas 79 does not match an impedance of the isolation circuit 76. An impedance mismatch may reduce effectiveness of the isolation of the TX and RX circuits 72, 74, resulting in inferior communication quality. In that case, the impedance of the impedance matching circuit 134 may be adjusted such that the impedance mismatch condition of the one or more antennas 79 is substantially reduced. That is, the impedance of the impedance matching circuit 134 is adjusted to balance the impedance of the one or more antennas 79.

Advantageously, the phase shifters 102, 104 enable the signals along the first path 92 and the second path 94 to be constructively combined. Combining the signals along both paths 92, 94 may recover power lost due to the baluns 110, 132. Further, the impedance matching circuit 134 increase or maximizes the isolation between the TX circuit 72 and the RX circuit 74 by offsetting an impedance mismatch between the impedance of the one or more antennas 79 and the impedance of the isolation circuit 76.

Figure 11:
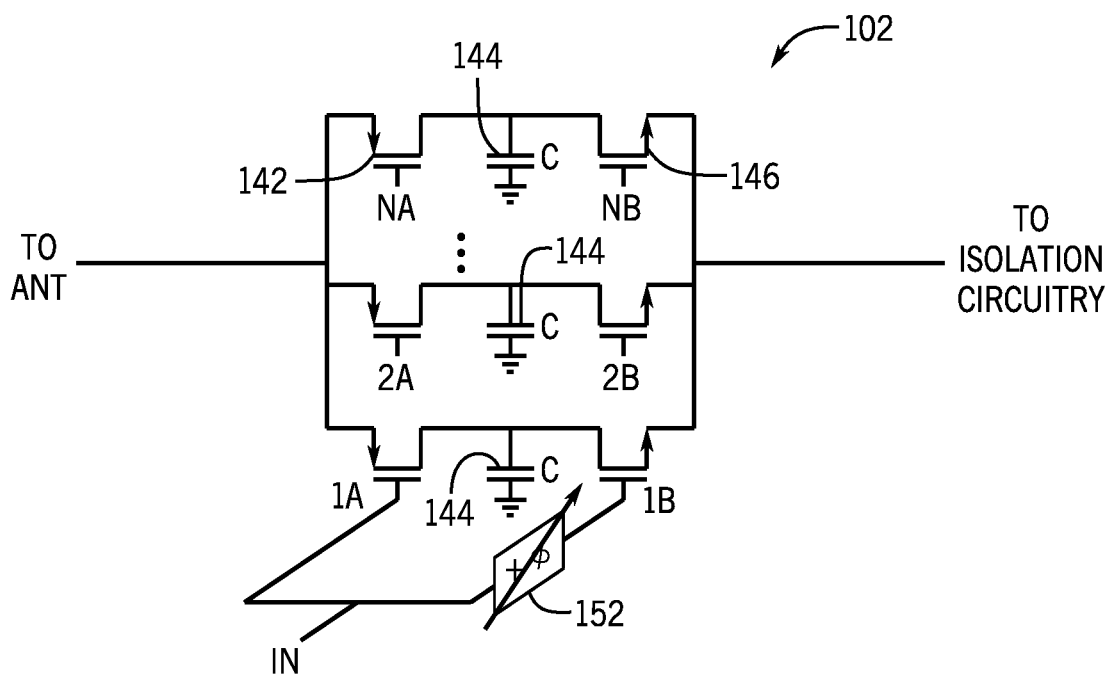
FIG. 11 is a schematic diagram of an example non-reciprocal phase shifter of the transceiver circuitry of FIG. 8, according to an embodiment of the present disclosure.

FIG. 11 is a schematic diagram of an example non-reciprocal phase shifter 102 of the transceiver circuitry 70 of FIG. 8, according to an embodiment of the present disclosure. The non-reciprocal phase shifter 102 may be a two-port n-path filter which includes a number (N) of capacitors 144 and transistors 142, 146 disposed in parallel and a phase shifter 152. Although not shown, the non-reciprocal phase shifter 102 may be coupled to one or more local oscillators to change a frequency of a signal propagating through the non-reciprocal phase shifter 102. In operation, the capacitors 144 may act as low-pass filters which attenuate the signals. The non-reciprocal phase shifter 102 may shift a phase of a signal from the one or more antennas 79 to the isolation circuit 76 by a first phase amount and shift a phase of a signal from the isolation circuit 76 to the one or more antennas 79 by a second phase amount different from the first phase amount. For example, as illustrated in FIGS. 10A-10C, the non-reciprocal phase shifter 102 may shift a phase of a signal from the one or more antennas 79 to the isolation circuit 76 by +90 degrees and shift a phase of a signal from the isolation circuit 76 to the one or more antennas 79 by −90 degrees.

Advantageously, the non-reciprocal phase shifter 102 may shift a phase of a signal therethrough without causing loss to the signal. Thus, the non-reciprocal phase shifter 102 enables the first portion of the signal therethrough to be combined with a second portion of the signal propagating along the second path 94 of the transceiver circuitry 70 discussed with respect to FIG. 8.

Figure 12:
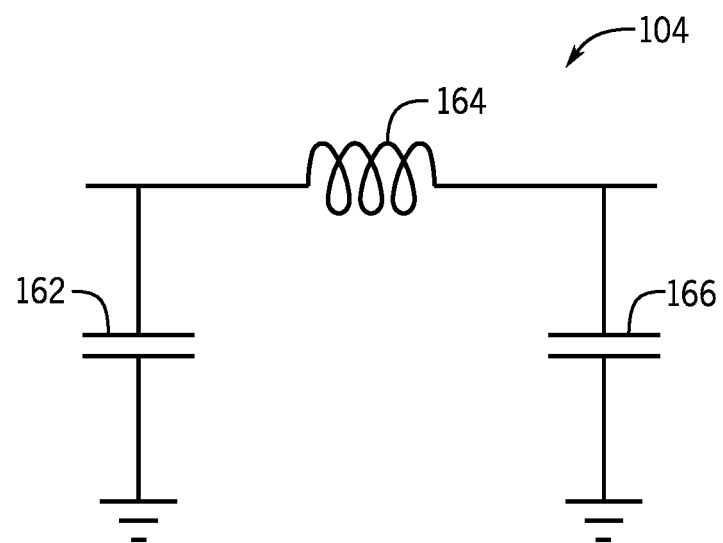
FIG. 12 is a schematic diagram of an example bi-directional phase shifter of the transceiver circuitry of FIG. 8, according to an embodiment of the present disclosure.

FIG. 12 is a schematic diagram of an example bi-directional phase shifter 104 of the transceiver circuitry 70 of FIG. 8, according to an embodiment of the present disclosure. As illustrated, the bi-directional phase shifter 104 includes two capacitors 162, 166 disposed in parallel to ground and an inductor 164 disposed between the capacitors 162, 166. The bi-directional phase shifter 104 shifts a phase of a signal therethrough by an amount regardless of a direction of the signal. For example, as illustrated in FIGS. 10A-10C, the bi-directional phase shifter 104 may shift a phase of a signal from the one or more antennas 79 to the isolation circuit 76 and from the isolation circuit 76 to the one or more antennas 79 by the same amount (e.g., +90 degrees).

Advantageously, if the bi-directional phase shifter 104 is disposed in parallel with the non-reciprocal phase shifter 102, the phase shift by the bi-directional phase shifter 104 enable the signals on the first path 92 and the second path 94 to be constructively combined by shifting the phase of the signal therethrough to be substantially in-phase with the shifted signal from the non-reciprocal phase shifter 102. Similarly, if the bi-directional phase shifter 104 is disposed in series with the non-reciprocal phase shifter 102, the phase shift of the bi-directional phase shifter 104 may increase or decrease the phase shift of the non-reciprocal phase shifter 102 such that the signals on the first path 92 and the second path 94 are substantially in-phase and can be constructively combined.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
   one or more antennas;
   a first phase shifter disposed on a first signal path coupled to the one or more antennas;
   a second phase shifter disposed on the first signal path;
   a balun coupling the first signal path and a second signal path;
   transmitter circuitry coupled to the balun; and
   receiver circuitry coupled to the balun opposite the transmitter circuitry and configured to receive a received signal via the one or more antennas, the first phase shifter configured to shift a first portion of the received signal by a first phase amount, and the second phase shifter configured to shift the first portion of the received signal from the first phase shifter by a second phase amount to constructively combine with a second portion of the received signal from the second signal path at the receiver circuitry via the balun, the first portion of the received signal being in-phase with the second portion of the received signal at the receiver circuitry, and the received signal being blocked from the transmitter circuitry via the balun.

2. The electronic device of claim 1, wherein the first phase shifter comprises a non-reciprocal phase shifter and the second phase shifter comprises a bidirectional phase shifter.

3. The electronic device of claim 2, wherein the non-reciprocal phase shifter is configured to receive the first portion of the received signal and shifts a phase of the first portion of the received signal by −90 degrees, and wherein the non-reciprocal phase shifter is configured to receive a first portion of a transmission signal and shifts a phase of the first portion of the transmission signal from the transmitter circuitry by +90 degrees, and wherein the non-reciprocal phase shifter comprises a plurality of capacitors disposed in parallel, each capacitor of the plurality of capacitors being disposed in series with at least two transistors of a plurality of transistors.

4. The electronic device of claim 2, wherein the bidirectional phase shifter shifts a phase of the received signal by +90 degrees and shifts a phase of a transmission signal from the transmitter circuitry by +90 degrees, and wherein the bidirectional phase shifter comprises at least two capacitors disposed in parallel and an inductor coupled to and disposed between the at least two capacitors.

5. The electronic device of claim 1, comprising a second balun coupled to the one or more antennas, the first signal path, and the second signal path, wherein the balun is configured to split a transmission signal from the transmitter circuitry into a first portion of the transmission signal on the first signal path and a second portion of the transmission signal on the second signal path.

6. The electronic device of claim 5, wherein the second balun is configured to constructively combine the first portion of the transmission signal as shifted by the first phase shifter and the second phase shifter with the second portion of the transmission signal.

7. The electronic device of claim 5, comprising an impedance matching circuit coupled to the second balun and the one or more antennas, wherein the impedance matching circuit is configured to correlate a first impedance of the one or more antennas to a second impedance of the second balun.

8. The electronic device of claim 1, wherein the first phase shifter is configured to generate a first shifted first portion of the received signal and the second phase shifter is configured to receive the first shifted first portion and generate a second shifted first portion of the received signal.

9. The electronic device of claim 8, wherein the second shifted first portion is configured to be in-phase with the second portion of the received signal at the receiver circuitry.

10. The electronic device of claim 1, wherein the first phase shifter and the second phase shifter are each disposed on the first signal path between the one or more antennas and the balun.

11. The electronic device of claim 1, wherein the transmitter circuitry is directly coupled to a first side of the balun and the receiver circuitry is directed coupled to a center tap of a second side of the balun opposite the transmitter circuitry.

12. A transceiver comprising:
   isolation circuitry comprising a balun, the balun coupled to a transmitter circuitry at a first side of the balun and coupled to a receiver circuitry at a second side of the balun, the isolation circuitry coupled to one or more antennas via a first signal path and a second signal path; and
   phase shifting circuitry coupled between the isolation circuitry and the one or more antennas on the first signal path, the phase shifting circuitry coupling to the one or more antennas via a combiner circuit, and the phase shifting circuitry comprising, a non-reciprocal phase shifter disposed on the first signal path between the one or more antennas and the isolation circuitry, the non-reciprocal phase shifter configured to shift a phase of a first portion of a receive signal received via the one or more antennas therethrough by a first phase amount, and a bidirectional phase shifter disposed on the first signal path between the one or more antennas and the isolation circuitry, the bidirectional phase shifter configured to shift the phase of the first portion of the receive signal from the non-reciprocal phase shifter by a second phase amount to constructively combine with a second portion of the receive signal on the second signal path at the receiver circuitry.

13. The transceiver of claim 12, wherein the non-reciprocal phase shifter comprises a plurality of capacitors disposed in parallel, and wherein each capacitor of the plurality of capacitors is disposed in series with at least two transistors of a plurality of transistors.

14. The transceiver of claim 12, wherein the bidirectional phase shifter comprises at least two capacitors disposed in parallel and an inductor coupled to and disposed between the at least two capacitors.

15. The transceiver of claim 14, wherein the non-reciprocal phase shifter and the bidirectional phase shifter are coupled to the one or more antennas in series.

16. The transceiver of claim 12, wherein the bidirectional phase shifter is configured to shift a phase of a first portion of a transmission signal transmitted via the transmitter circuitry by the second phase amount, and the non-reciprocal phase shifter is configured to shift the phase of the first portion of the transmission signal from the bidirectional phase shifter by a third phase amount to constructively combine with a second portion of the transmission signal on the second signal path at the one or more antennas.

17. An electronic device, comprising:
one or more antennas configured to transmit a transmission signal and receive a receive signal;
a transmitter coupled to the one or more antennas via a first signal path and a second signal path and configured to generate the transmission signal;
a receiver coupled to the one or more antennas via the first signal path and the second signal path and configured to receive the receive signal;
a balun coupling the first signal path and a second signal path;

a first phase shifter coupled to the one or more antennas and disposed on the first signal path, wherein the first phase shifter is configured to shift a first portion of the receive signal by a first phase amount;
a second phase shifter coupled to the one or more antennas and disposed on the first signal path, wherein the second phase shifter is configured to shift the first portion of the receive signal from the first phase shifter by a second phase amount; and
isolation circuitry coupled to the one or more antennas, the first phase shifter, the second phase shifter, the transmitter, and the receiver, wherein the isolation circuitry is configured to constructively combine the first portion of the receive signal as shifted by the first phase shifter and the second phase shifter from the first signal path with a second portion of the receive signal from the second signal path at the receiver via the balun, the first portion of the receive signal being in phase with the second portion of the receive signal at the receiver.

18. The electronic device of claim 17, wherein the balun is configured to constructively combine the first portion of the receive signal as shifted by the first phase shifter and the second phase shifter with a second portion of the receive signal at the receiver, the first portion of the received signal being in-phase with the second portion of the received signal at the first balun, and the first portion of the receive signal and the second portion of the receive signal being blocked from the transmitter via the first balun.

19. The electronic device of claim 18, wherein the first phase shifter comprises a non-reciprocal phase shifter and the second phase shifter comprises a bidirectional phase shifter, the non-reciprocal phase shifter and the bidirectional phase shifter coupled between the one or more antennas and the first balun in a series.

20. The electronic device of claim 17, wherein the isolation circuitry comprises a second balun, the second balun configured to constructively combine the first portion of the transmission signal as shifted by the first phase shifter and the second phase shifter with the second portion of the transmission signal at the one or more antennas, the first portion of the transmission signal being out of phase with the second portion of the transmission signal at the receiver.

* * * * *